US007485205B2

(12) United States Patent
DeVries et al.

(10) Patent No.: US 7,485,205 B2
(45) Date of Patent: Feb. 3, 2009

(54) METHOD, ARRANGEMENT AND ELECTRODE FOR GENERATING AN ATMOSPHERIC PRESSURE GLOW PLASMA (APG)

(75) Inventors: Hindrik Wilem DeVries, Tilburg (NL); Jan Bastiaan Bouwstra, Bilthoven (NL)

(73) Assignee: Fuji Photo Film B.V., Tilburg (NL)

( * ) Notice: Subject to any disclaimer, the term of this patent is extended or adjusted under 35 U.S.C. 154(b) by 381 days.

(21) Appl. No.: 10/929,721

(22) Filed: Aug. 31, 2004

(65) Prior Publication Data

US 2005/0150602 A1 Jul. 14, 2005

(30) Foreign Application Priority Data

Sep. 30, 2003 (EP) .................................. 03078032

(51) Int. Cl.
*H01L 21/00* (2006.01)
*C23C 16/00* (2006.01)

(52) U.S. Cl. ................ 156/345.43; 216/67; 118/723 E; 118/718

(58) Field of Classification Search ............ 156/345.43, 156/345.44, 345.45, 345.46, 345.47; 118/723 E, 118/718
See application file for complete search history.

(56) References Cited

U.S. PATENT DOCUMENTS 6,863,020 B2 * 3/2005 Mitrovic et al. .......... 118/723 E

FOREIGN PATENT DOCUMENTS

| | | | | |
|---|---|---|---|---|
| EP | 1029702 | | | 2/2000 |
| EP | 1340838 | | | 11/2001 |
| EP | 1286382 | | | 8/2002 |
| JP | 2001049440 | A | * | 2/2001 |
| JP | 2002339075 | A | * | 11/2002 |
| JP | 2003166063 | A | * | 6/2003 |
| JP | 2003201570 | A | * | 7/2003 |
| JP | 2003268555 | A | * | 9/2003 |

* cited by examiner

*Primary Examiner*—Parvis Hassanzadeh
*Assistant Examiner*—Michelle Crowell
(74) *Attorney, Agent, or Firm*—Davidson Berquist Jackson & Gowdey LLP

(57) ABSTRACT

Method of generating an atmospheric pressure glow discharge plasma (APG), wherein said plasma is generated in a discharge space formed between at least one first electrode surface and at least one second electrode surface. The method comprises at least the steps of supplying a gaseous substance to said discharge space and powering said first and said second electrode surface for generating said plasma. Said step of supplying a gaseous substance to the discharge space comprises providing at least one intermediate gas supply stream from at least one of said first and second electrode surfaces. The step of supplying said gaseous substance to the discharge space further comprises providing a main gas supply stream for forcing the at least one intermediate gas supply stream in a direction along the first and second electrode surfaces.

20 Claims, 4 Drawing Sheets

METHOD, ARRANGEMENT AND ELECTRODE FOR GENERATING AN ATMOSPHERIC PRESSURE GLOW PLASMA (APG)

This application claims priority to European Patent Application No. 03078032.4, filed 30 Sep. 2003, which is incorporated by reference herein.

FIELD OF THE INVENTION

The present invention relates to a method of generating an atmospheric pressure glow discharge plasma (APG), wherein said plasma is generated in a discharge space formed between at least one first electrode surface and at least one second electrode surface, said method at least comprising the steps of supplying a gaseous substance to said discharge space and powering said first and said second electrode surface for generating said plasma, wherein said step of supplying a gaseous substance to said discharge space comprises providing at least one intermediate supply stream in said discharge space near said first or said second electrode surface, said at least one intermediate supply stream being provided in a direction crossing at least one of said first and second electrode surfaces.

The present invention further relates to an arrangement for generating an atmospheric pressure glow discharge plasma (APG), comprising a discharge space for generating said plasma formed between at least one first electrode surface and at least one second electrode surface, means arranged for supplying a gaseous substance to said discharge space and means arranged for powering said first and said second electrode surface for generating said plasma, wherein said means arranged for supplying a gaseous substance comprises at least one intermediate inlet arranged for providing an intermediate supply stream in a direction crossing at least one of said first and second electrode surfaces, said at least one intermediate inlet being located in said discharge space near said first or said second electrode surface.

The present invention further relates to an electrode for use in an arrangement as described above.

BACKGROUND OF THE INVENTION

European Patent Application no. EP 1 029 702, discloses a method and arrangement for carrying out a surface treatment using a plasma. The document discloses a variety of embodiments, amongst which are arrangements comprised of a plurality of electrodes forming a discharge space, which electrodes are further arranged for supplying a gaseous substance to the discharge space. The arrangements are further arranged for transporting a film or another medium to be treated through said discharge space. A gas supply provides a gaseous substance to the discharge space in a direction which is substantially perpendicular to the medium to be treated at the location of entrance of the gasstream.

Surface treatment methods and arrangements based on plasma generation are widely used in numerous industries. In photo film industry for instance, similar surface treatment methods are used for preparing thermoplastic polymer films in order to improve the adhesion properties of their surfaces.

A requirement for almost all surface treatment processes is that the surface must be treated by the plasma as homogeneous and uniform as possible. This may be achieved by treating the surface with a stable and homogeneous plasma.

An atmospheric pressure glow plasma is generated by supplying a carrier gas to a discharge space formed between a plurality of electrodes and powering said electrodes using for instance an alternating-current voltage (AC voltage). By transporting a sheet of material to be processed through the discharge space, the plasma can be used for carrying out the surface treatment process. An example of this is the transporting of a polymer film (such as polyethyleneterephtalate (PET), polyethylenenaphtalate (PEN), polytetrafluoroethylene (PTFE), triacetate cellulose (TAC), and the like) over a first electrode through a discharge space formed by said first electrode and one or more second electrodes, whilst supplying a gas to the discharge space and powering the electrodes.

A continuous supply of gas is required in order to maintain the plasma. This may be achieved for instance as described in the above-mentioned document EP 1 029 702, by providing a gasstream through holes or inlets in the second electrodes, such that the gas fills the discharge space adjacent to the material to be treated (present on the first electrode). Although gas is continuously supplied to the discharge space, it has been observed that using a method as described in the above-mentioned document, generating a stable atmospheric pressure glow plasma still provide difficulties.

One of these difficulties, for instance, is that a gas supply as described, which provides a flow of gas which originates from a second electrode and is more or less directed to a first electrode, may give rise to the existence of various flow instabilities, such as vortices, in the discharge space. These instabilities may cause temporal uneven local distributions and density variations of the gas in the discharge space, that may be the cause of instabilities in the generated APG plasma.

Another difficulty, related to the existence of flow instabilities in the discharge space, is the existence of area's in the discharge space that are isolated by the flow (e.g. wakes) due to nearby vortices. In these wakes or area's the supply of fresh gas may be reduced to a minimum, and pollution from numerous sources may build up there. Similar to this is the build-up of pollution in the vortices themselves due to the local pressure minimum and the amount of circulation present in the vortex. Vortices may in fact locally increase the residence time of the flow, increasing the duration over which contaminants may build up in the gas. It may be understood that the build-up of pollution in certain area's of the discharge space may cause the atmospheric pressure glow plasma to be unstable, shortening the uniformity and lifetime thereof and increasing the probability of the occurrence of streamers (filamentary discharges with a short lifetime). This has a negative effect on the surface treatment process.

SUMMARY OF THE INVENTION

The present invention has for it's object to provide a method and arrangement for generating a stable and uniform atmospheric pressure glow plasma, suitable for use in a surface treatment method.

The above and other objects are achieved by the present invention in that it provides a method according to the preamble of claim 1, characterized in that, said step of supplying said gaseous substance to said discharge space further comprises providing a main gas supply stream for forcing said at least one intermediate gas supply stream in a direction along said first and second electrode surfaces.

By providing a main gas supply stream as described above and forcing said at least one intermediate gas supply stream in a direction along said first and second electrode surfaces, a constant flow through the discharge space along said first and second electrode surfaces is established, such that vortices caused by the intermediate gas supply stream do not have a chance to be established. Therefore a constant flow of fresh gas, which is continuously regenerated by the one or more intermediate gas supply streams throughout the discharge space, is established, reducing the density of contaminants and providing a more uniform gas density profile as well as a more uniform velocity profile of the gas in the discharge space. It has been observed that these conditions contribute to a large extent to the stability of the atmospheric pressure glow plasma generated between the first and second electrodes.

It is noted here that optimal conditions are achieved when the main gas supply stream follows the form and dimensions of the discharge space as much as possible. Therefore, in an embodiment of the present invention wherein said at least one first electrode surface and said at least one second electrode surface are substantially flat, said main gas supply stream is directed substantially parallel to said at least one first electrode surface and said at least one second electrode surface.

It will be understood that by directing the main gas supply already from where it enters the discharge space in a direction parallel to the first and second electrode surfaces, the main gas supply stream having the desired direction in the discharge space may easily be achieved.

In another embodiment, wherein said first electrode surface is formed by a cylinder-shaped electrode surface and said at least one second electrode surface comprises one or more electrodes opposite said cylinder-shaped electrode surface, the main gas supply stream is directed substantially tangential to said cylinder-shaped electrode surface. As a result, the main gas supply stream follows the form and dimensions of the discharge space, providing optimal flow conditions for forming said atmospheric glow plasma.

In another embodiment of the invention, said at least one intermediate gas supply stream is provided to said discharge space through at least one of said first and second electrode surfaces.

This embodiment provides the advantage of supplying fresh gas in the discharge space near the first and second electrode, where the plasma is generated, such that the carrier gas is regenerated locally, at the location where the plasma is generated, providing optimal conditions for generating the APG plasma.

According to another embodiment of the invention, wherein at least one of said first and second electrode surfaces comprises a plurality of adjacently spaced electrodes, this may be achieved by having said at least one intermediate gas supply stream enter said discharge space through spaces between said adjacently spaced electrodes.

The surfaces of the electrodes may therefore be left intact, and the presence of undesired structures and impurities on the surface of the electrodes, which may deform the electric field or may be the cause of plasma instabilities, is prevented.

In a preferred embodiment of the present invention, said at least one of said first and second electrode surfaces comprises a plurality of adjacent electrodes, and said at least one intermediate gas supply stream is transported through said electrodes before entering the discharge space.

This provides the additional advantage that the fresh gas, which is transported through the electrodes, provides a cooling effect to the electrodes. This may improve the performance of the surface treatment method, as without cooling the temperature of the electrodes will increase over time, having a negative effect on the stability of the plasma.

In another embodiment of the present invention, said at least one intermediate gas supply stream is provided to said discharge space under an angle downstream of said main gas supply stream.

It will be understood that by directing the intermediate gas supply stream in the same direction as the main gas supply stream, the flow conditions are improved, since less energy is required by the main flow for forcing the intermediate gas supply stream in the desired direction. However, constructing a intermediate gas inlet which directs the intermediate gas supply stream in the exact same direction as the main gas supply stream is difficult as the discharge space itself should ideally be clear of any constructions which may obstruct the plasma generation process or may be the source of vortices in the main gas supply stream. The embodiment described above, does not encounter these difficulties, while at the same time, the intermediate gas supply stream is still to some extend directed in the downstream direction of the main flow and therefore less energy is required for forcing the flow in the desired direction (as compared to the case wherein the intermediate gas supply stream and the main stream are perpendicular).

In a preferred embodiment, wherein said first electrode surface is arranged for moving a film through said discharge space for treating a surface of said film using said plasma, the direction of the main gas supply stream is equal to the direction of the movement of said film.

By providing the main gas supply stream in the same direction as the movement of said film, the main flow itself is more stable since the relative velocity differences in the boundary layer between the moving film and the main gas supply stream are much smaller, and therefore the probability of the occurence of flow instabilities originating from this boundary layer are reduced and a more uniform flow is achieved. A person skilled in the art may understand that a main gas supply stream which is in counter direction to the moving film may give rise to turbulent effect more easily, while having both the moving film and the main gas flow going in the same direction may keep the flow laminar for a longer period of time.

In another embodiment of the present invention, after travelling along said first electrode surfaces, said main gas supply stream is directed to a gas outlet for removing said gaseous substance from said discharge space.

It maybe understood that, in this embodiment contaminants may effectively be removed from the discharge space.

According to a second aspect of the present invention there is provided an arrangement for generating an atmospheric pressure glow discharge plasma (APG), comprising a discharge space for generating said plasma formed between at least one first electrode surface and at least one second electrode surface, means arranged for supplying a gaseous substance to said discharge space and means arranged for powering said first and said second electrode surface for generating said plasma, wherein said means arranged for supplying a gaseous substance comprises at least one intermediate gas inlet arranged for providing an intermediate gas supply stream from at least one of said first and second electrode surfaces, characterised in that, said means for supplying a gaseous substance further comprises a main gas inlet arranged for providing a main gas supply stream for forcing said intermediate gas supply stream in a direction along said first and second electrode surfaces.

In an embodiment thereof, said plurality of electrodes comprises one or more gas inlet holes for forming said at least one intermediate gas inlet. Such holes may for instance be boreholes that may be connected to a gas supply system.

According to a third aspect of the present invention, there is provided an electrode surface arrangement comprised of a plurality of electrodes for forming an electrode surface for use in a method or arrangement according to said first or second aspect of the invention, wherein at least one of said electrodes is arranged for transporting at least one intermediate gas supply stream.

In a preferred embodiment thereof, wherein each of said plurality of electrodes is adjacently placed to at least one other of said electrodes, each of said plurality of electrodes comprising at least one side surface facing said adjacent at least one other of said electrodes, further comprising one or more gas inlets arranged for providing said intermediate gas supply stream to said discharge space, said one or more gas inlets are located in said at least one side surface.

An electrode according to this embodiment combines the advantages of an electrode comprising means for transporting the intermediate gas supply with the advantages of adjacently spaced electrodes wherein the intermediate gas supply stream is provided to the discharge space through the one or more spaces formed in between the adjacently spaced electrodes. Therefore the electrodes according to this embodiments are cooled by the intermediate gas supply stream while at the same time, in use, the gas in the discharge space near the electrodes is regenerated as the intermediate gas stream enters the discharge space in between each of the adjacently spaced electrodes.

The present invention will now be further elucidated by a description and drawings referring to a preferred embodiment thereof, directed to a surface treatment of polymer films for photographic purposes. The invention is not limited to the embodiments disclosed, which are provided for explanatory purposes only. Note that the teachings of this invention may be applied in material processing and/or surface treatment processes in numerous industries. They may be used for all kinds of surface treatments, amongst which are cleaning and activation of surfaces, deposition such as plasma enhanced chemical vapour deposition (PECVD) etc. The teachings of this invention are also suitable for improving the adhesive properties of a surface.

DETAILED DESCRIPTION OF THE DRAWINGS

Figure 1:
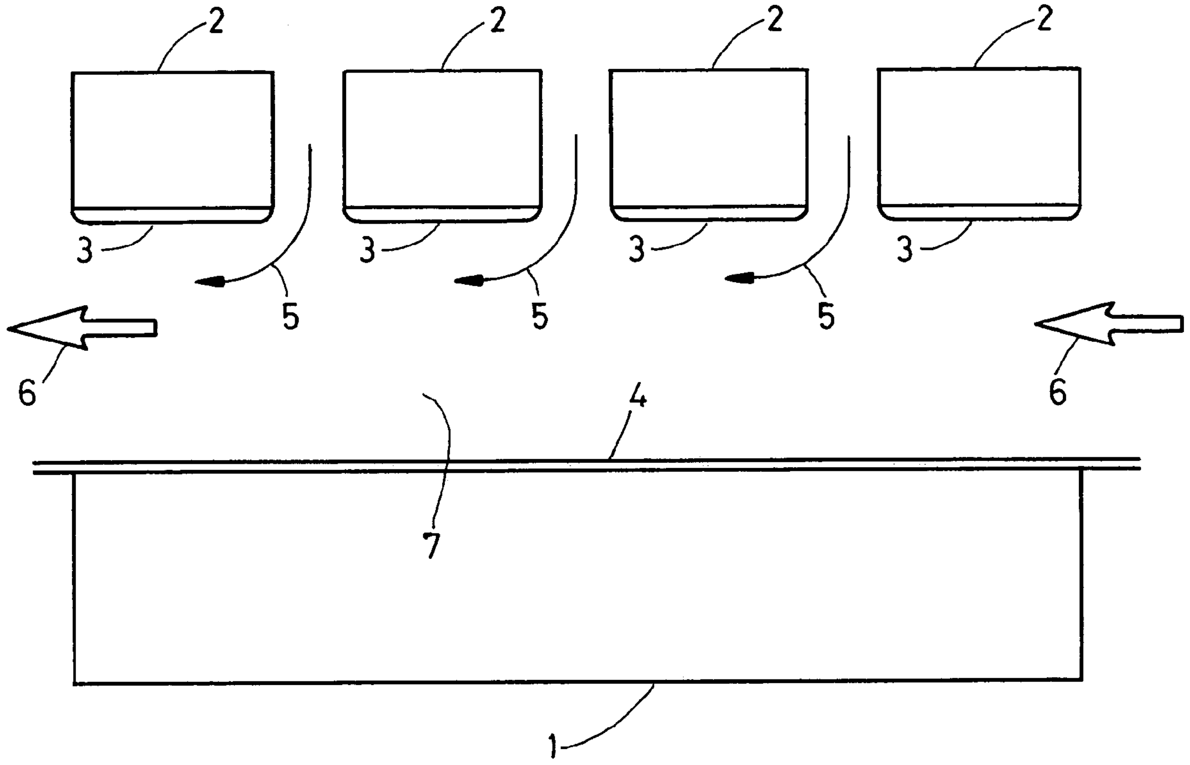
FIG. 1 shows an embodiment of the present invention.

FIG. 1 shows an embodiment of the present invention, wherein a polymer film 4, which is to be treated by an atmospheric pressure glow plasma, is transported over the surface of a first electrode 1. A plurality of second electrodes 2 are placed opposite said first electrode 1, forming a discharge space 7. The surfaces of each of the second electrodes 2 is covered with, for instance, a dielectric material 3. The plurality of electrodes 2 is adjacently spaced to each other.

Gas is supplied to the discharge space 7 to a plurality of holes formed by the adjacently spaced second electrodes 2, such that a plurality of intermediate gas supply streams 5 are formed. These intermediate gas supply stream are initially directed from the second electrodes 2 towards the first electrode 1, such that if these intermediate gas supply streams were left to be undisturbed, each of the intermediate gas supply streams 5 would hit the surface of the polymer film 4. This is avoided by providing a main gas supply stream 6 which is directed along the surfaces of the electrodes 1 and 2. The main gas supply stream is chosen such that the intermediate gas supply streams 5 are forced in the direction of the main supply stream 6. In fact, the intermediate gas supply stream 5 are carried along with the flow of the main gas supply stream 6. The forming of vortices is thereby prevented.

The advantages of the arrangement of FIG. 1 are clear; because of the fact that the forming of vortices is prevented, a more homogeneous flow is established in the discharge space 7. The gas present in the discharge space 7 is thereby constantly refreshed, everywhere in the discharge space. The intermediate gas supply streams 5 make sure that sufficient fresh gas will be present near each of the electrodes, including the electrodes further downstream of main gas supply stream 6. The establishment of a main gas supply flow 6, carrying along each of the intermediate gas supply streams 5, forcing them in the downstream direction, prevents the occurrence of vortices and area's that are isolated from the flow. The prevention of vortices and isolated areas avoids a number of undesired effects, such as the build-up of contaminants in the gas present in the discharge space 7 and/or heat accumulation in the discharge space 7. It therefore eliminates a number of sources that may give rise to instabilities of the atmospheric pressure glow plasma generated between electrodes 1 and 2.

Figure 2:
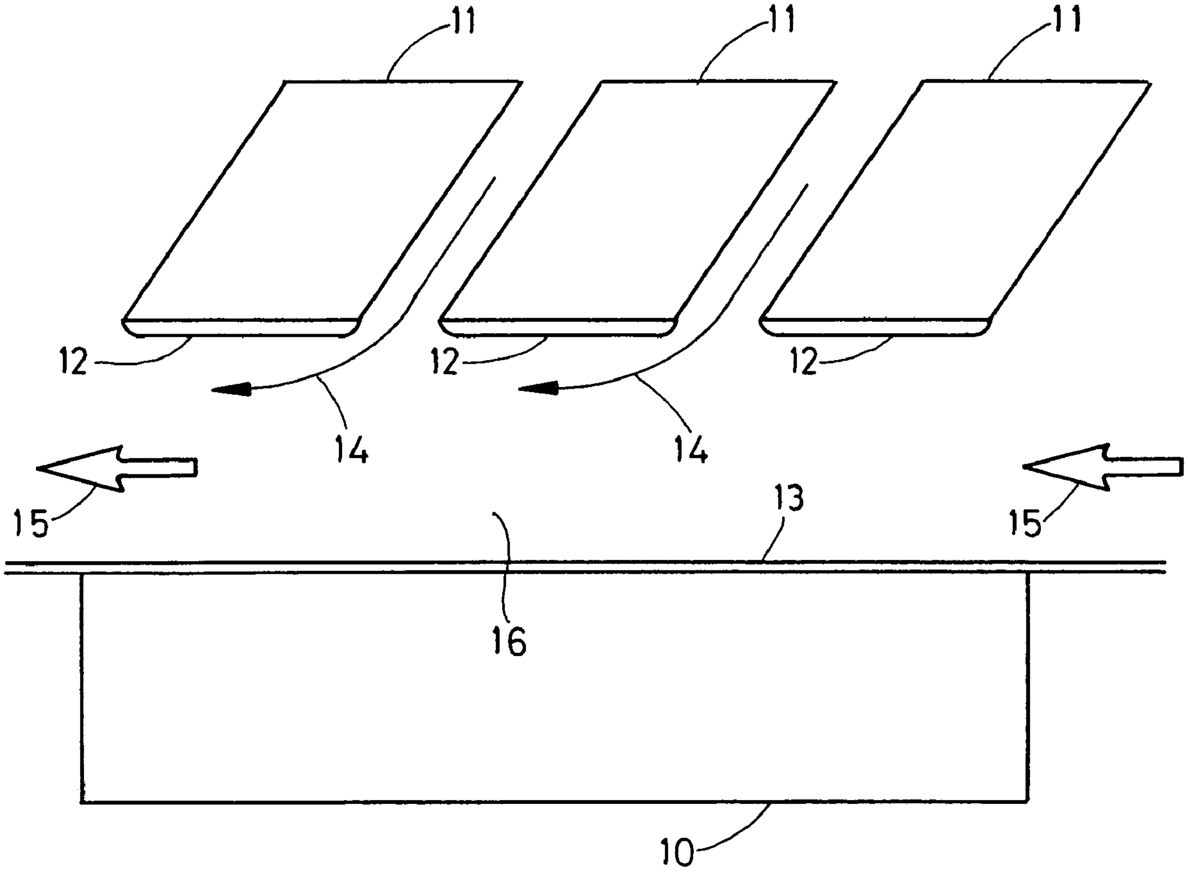
FIG. 2 shows another embodiment of the present invention.

In FIG. 2, a plurality of second electrodes 11 are adjacently spaced with respect to each other, similar to the electrodes 2 of FIG. 1. The electrodes 11 are opposite the first electrode 10, together forming a discharged space 16 for generating an atmospheric pressure glow plasma. First electrode 10 transports over it's surface a medium 13 to be treated by the atmospheric pressure glow plasma. The surfaces of each of the electrodes 11 facing the first electrode 10, maybe covered with a dielectric layer 12.

As in FIG. 1, a plurality of intermediate gas supply streams 14 is provided through a plurality of openings in between each of the adjacently spaced second electrodes 11. The second electrodes 11 are shaped such, that the intermediate gas supply streams 14 are directed to some extend in a downstream direction of main gas supply stream 15, under an angle therewith. Main gas supply stream 15 carries along the plurality of intermediate gas supply streams 14, similar to the embodiment described in relation with FIG. 1. It is noted here, that by directing the intermediate gas supply stream 14 in a downstream direction of main gas supply stream 15, under an angle therewith, the energy required for the main flow 15 in order to force the intermediate gas supply stream 14 in the downstream direction, along the surface of the first electrode 10 and the surfaces of the second electrodes 11, is reduced compared to the situation shown in FIG. 1. This is due to the fact that the deflection angle of the intermediate streams in the mainstream has become smaller.

Figure 3:
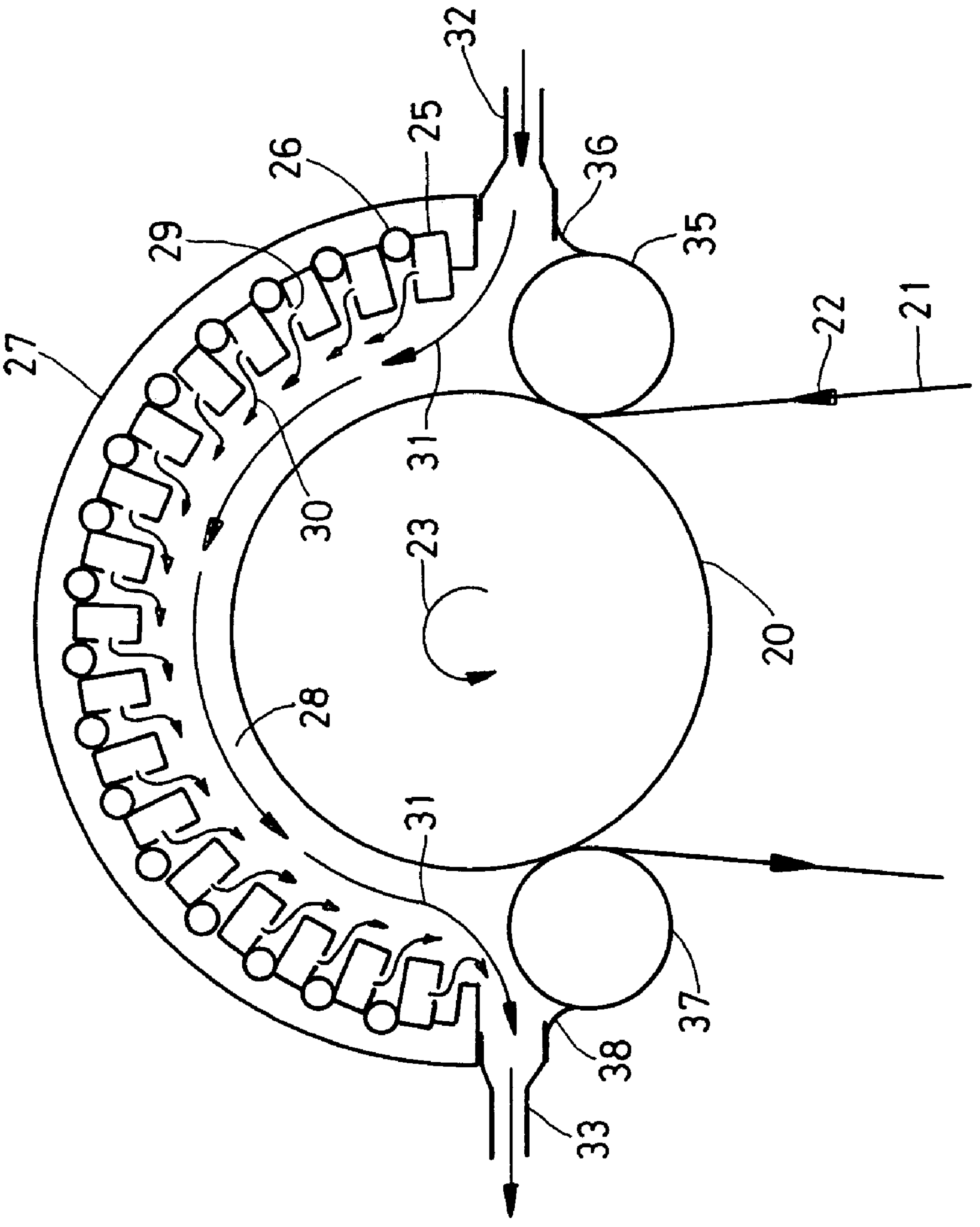
FIG. 3 shows an arrangement for treating a surface of a medium using an atmosphere pressure glow plasma, according to an embodiment of the present invention.

FIG. 3 shows another embodiment of the present invention, wherein a medium 21 to be treated, for instance a polymer film, is transported over a cylinder-shaped first electrode 20 through a discharge space 28. The direction of the medium is given by the arrow 22, and rotation direction of cylinder-shaped electrode 20 is given by arrow 23. A plurality of electrodes 25, altogether forming a second electrode surface, is placed on a framework 27 opposite the surface of said first cylinder-shaped electrode 20.

The electrodes 25 are adjacently spaced to each other, and are sealed using a plurality of sealing elements 26. Each of the sealing elements 26 is placed in between the adjacently spaced electrodes 25 to the back end thereof, wherein the back end of each of the electrodes 25 is defined as the part of the electrode which is furthest away from the first electrode 20 and the discharge space 28.

Inlet openings 29 in each of the electrodes 25 are arranged for providing an intermediate gas supply stream 30 from each of the electrodes. Therefore, a plurality of intermediate gas supply streams 30 originates from the second electrode surface formed by the plurality of electrodes 25.

In order to force each of the intermediate gas supply streams 30 along the surfaces of the first electrode surface 20 and the electrodes 25, a main gas supply stream 31 is established in the discharge space 28 using a main gas supply inlet 32 at the upstream end and a gas outlet 33 at the downstream end. The discharge space 28 is sealed from it's exterior by a sealing roll 35 and a flexible sealing wall 36 near main gas supply inlet 32. Near the gas outlet 33 of the system, the discharge space 28 is sealed in a similar way by sealing roll 37 and sealing wall 38 (similar to roll 35 and roll 36). Note that the direction of the main gas supply stream 31 along the discharge space is the same as the direction of the moving medium 21 transported by the first electrode surface 20. The geometry of the system and the discharge space 28 is such that the main stream follows the discharge space 28 in the tangential direction.

Figure 4:
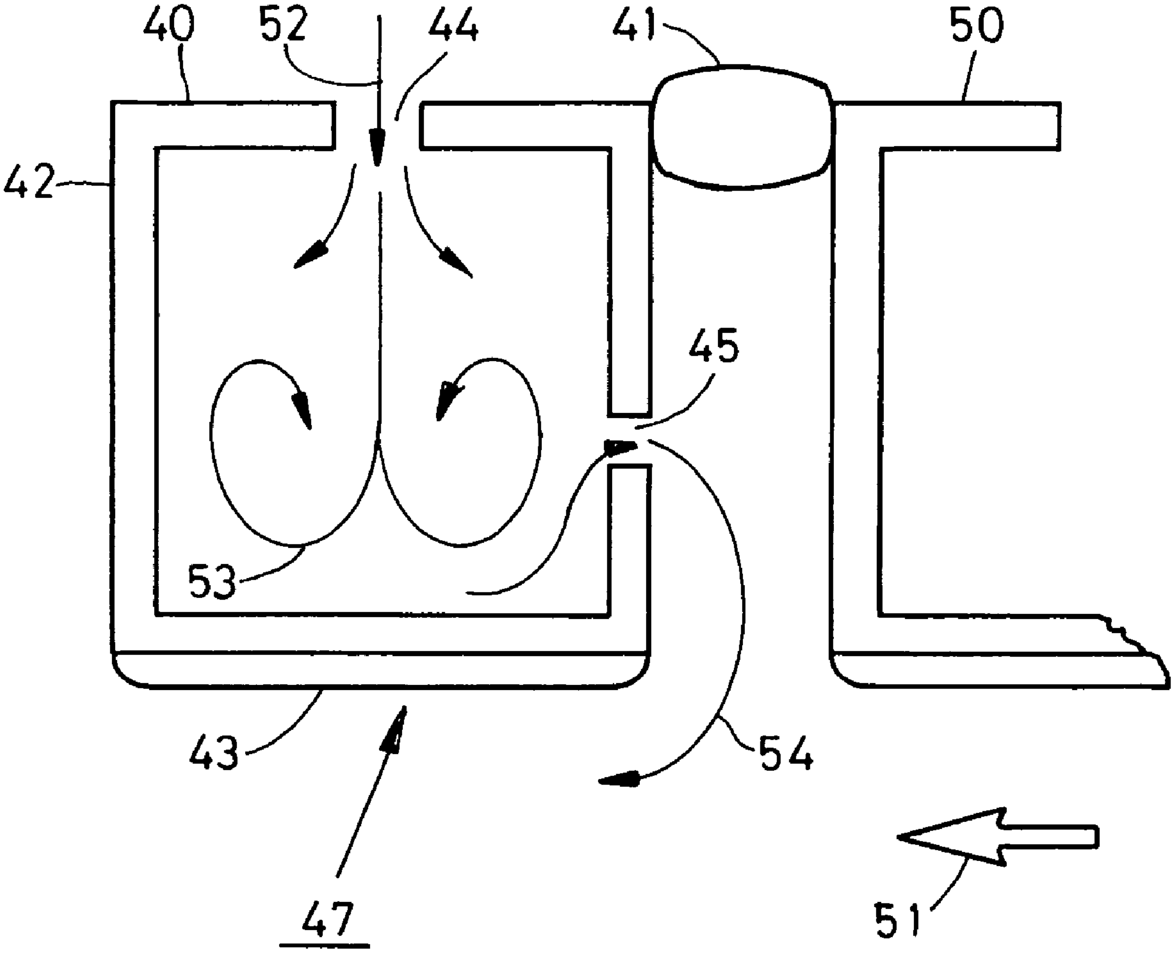
FIG. 4 shows an enlargement of an electrode for use in a method and arrangement according to the present invention.

An enlargement of an electrode that maybe used in the arrangement of FIG. 3 or the embodiments of FIG. 1, is shown in FIG. 4. An electrode 40 is adjacently spaced to another electrode 50 (note that only half of the electrode 50 is shown for the purpose of clarity, however the electrode 50 maybe similar to the electrode 40). The space in between electrodes 40 and 50 is closed by a sealing element 41. In the discharge space 47, a main gas supply stream 51 is provided in order to force the intermediate gas supply stream 54, coming from the opening between electrodes 40 and 50 in the downstream direction, along the surfaces of the electrodes 40 and 50. The surfaces of the electrodes 40 and 50 is covered by a dielectric layer 43. The electrodes 40 and 50 itself are hollow and, as shown for electrode 40, each comprise an electrode inlet 44 and an electrode outlet 45. Note that the electrode outlet 45 is located on the sidewall of the electrode 40 facing the adjacent electrode 50, such that the electrode 45 is adjacent to the opening between electrodes 40 and 50.

A gas stream 52 is supplied through the electrode inlet 44 filling the interior of the electrode 40 with fresh gas. Note that vortices 53 may be present in the interior of electrode 40, however here they may not be undesired, given the thermodynamic mixing caused by these vortices. A gas stream 54 leaves the interior of electrode 40 to the electrode outlet 45, forming the intermediate gas supply stream 54 which is carried along with the main flow 51, in accordance with the present invention.

It will be understood that electrodes such as electrode 40 shown in FIG. 4, are beneficial to the invention, due to the gas stream present in the interior of the electrode 40.

For the purpose of comprehensiveness is as noted here that numerous modifications and variations of the present invention are possible in the light of the above teachings, without applying any inventive skills. It is therefore understood that within the scope of the appended claims, the inventions maybe practised otherwise than as specifically described herein.

The invention claimed is:

1. A method of generating an atmospheric pressure glow discharge plasma (APG), wherein said plasma is generated in a discharge space formed between at least one first electrode surface and at least one second electrode surface, said method at least comprising the steps of supplying a gaseous substance to said discharge space and powering said first and said second electrode surfaces for generating said plasma, wherein said step of supplying a gaseous substance to said discharge space comprises providing a main gas supply stream through a main gas inlet for supplying said gaseous substance and providing a plurality of intermediate gas supply streams through a plurality of intermediate gas inlets from a plurality of second electrode surfaces for refreshing said gaseous substance throughout said discharge space,—wherein said main gas supply stream has a flow greater than the intermediate flow that is sufficient for carrying the plurality of intermediate gas supply streams along with and forcing the plurality of intermediate gas supply streams in a direction along said first and second electrode surfaces, for preventing the establishment of vortices and wakes in said discharge space.

2. The method according to claim 1, wherein said at least one first electrode surface and a plurality of second electrode surfaces are substantially flat, and wherein said main gas supply stream is directed substantially parallel to said at least one first electrode surface and said plurality of second electrode surfaces.

3. The method according to claim 1, wherein said first electrode surface is formed by a cylinder shaped electrode surface and the plurality of second electrode surfaces comprises a plurality of electrodes opposite said cylinder shaped electrode surface, and wherein said main gas supply stream is directed substantially tangential to said cylinder shaped electrode surface.

4. The method according to claim 1, wherein the plurality of second electrode surfaces comprises a plurality of adjacently spaced electrodes, and wherein said at least one intermediate gas supply streams enters said discharge space through spaces between said adjacently spaced electrodes.

5. The method according claim 1, wherein the plurality of second electrode surfaces comprises a plurality of adjacent electrodes, and wherein said plurality of intermediate gas supply streams is transported through said electrodes before entering said discharge space.

6. The method according to claim 1, wherein the plurality of intermediate gas supply streams is provided to said discharge space at a downstream directed angle relative to the main gas supply stream.

7. The method according to claim 1, wherein said first electrode surface is arranged for moving a film through said discharge space for treating a surface of said film using said plasma, wherein the direction of said main gas supply stream is equal to the direction of said movement of said film.

8. The method according to claim 1, wherein after traveling along said first and second electrode surfaces, said main gas supply stream is directed to a gas outlet for removing said gaseous substance from said discharge space.

9. An arrangement for generating an atmospheric pressure glow discharge plasma (APG), comprising a discharge space for generating said plasma formed between at least one first electrode surface and a plurality of second electrode surfaces, a gaseous substance supply into said discharge space and a power supply connected to the first and said second electrode surfaces for generating said plasma, wherein the gaseous substance supply comprises a main gas supply inlet through which a main gas stream is introduced to said discharge space and a plurality of intermediate gas inlets arranged for providing a plurality of intermediate gas supply streams from the a plurality of second electrode surfaces to refresh said gaseous substance throughout said discharge space, wherein said main gas supply inlet provides a main gas supply stream having a flow that is greater than the plurality of intermediate gas supply streams and is sufficient for carrying the intermediate gas supply streams along with and forcing said intermediate gas supply streams in a direction along said first and second electrode surfaces thereby preventing the establishment of vortices and wakes in said discharge space.

10. The arrangement according to claim 9, wherein said at least one first electrode surface and said plurality of second electrode surface are substantially flat, and wherein said main gas inlet is arranged for directing said main gas supply stream substantially parallel to the first and second electrode surfaces.

11. The arrangement according to claim 9, wherein said at least one first electrode surface is formed by a cylinder shaped electrode surface and the plurality of second electrode surfaces comprises a plurality of electrodes opposite said cylinder shaped electrode surface, and wherein said main gas inlet is arranged for directing said main gas supply stream substantially tangential to said cylinder shaped electrode surface.

12. The arrangement according to claim 9, wherein the plurality of second electrode surfaces comprises a plurality of adjacently spaced electrodes arranged for providing the plurality of intermediate gas supply streams to said discharge space through spaces formed between said plurality of adjacently spaced electrodes.

13. The arrangement according claim 9, wherein the plurality of second electrode surfaces comprises a plurality of electrodes arranged for transporting a like plurality of intermediate gas supply streams before such intermediate gas supply streams enter said discharge space.

14. The arrangement according to claim 13, wherein said plurality of electrodes comprise a plurality of gas inlet holes for forming the plurality of intermediate gas inlets.

15. The arrangement according to claim 9, wherein the plurality of intermediate gas inlets are arranged for providing said intermediate gas supply streams to said discharge space at a downstream directed angle relative to said main gas supply stream.

16. The arrangement according to claim 9, wherein said first electrode surface is arranged for moving a film through said discharge space for treating a surface of said film using said plasma, and wherein said main gas inlet is arranged for directing said main gas supply stream in substantially the same direction as the direction of said movement of said film.

17. The arrangement according to claim 9, further comprising a gas outlet for removing said gaseous substance from said discharge space.

18. An electrode surface arrangement for an atmospheric pressure glow discharge plasma system according to claim 9, wherein a plurality of electrodes forming an electrode surface, each of said plurality of electrodes being spaced from adjacent electrodes and sealed there from, wherein each of said plurality of electrodes comprises a shaped electrode having top, bottom and opposing side walls that collectively define a hollow interior and wherein each of the opposing side walls face in the direction of adjacent electrodes, said intermediate gas flow entering into the hollow interior through a gas inlet in the top wall so that the hollow interior internally transports the intermediate gas supply stream, with the intermediate gas flow exiting the hollow interior through a gas outlet provided in one of the opposing side walls in a direction toward an adjacent electrode and on the discharge space side of the seal to thereby provide the intermediate gas supply stream into said discharge space from between adjacent electrodes.

19. The electrode surface arrangement according to claim 18, wherein the flow of the intermediate gas within the hollow interior is turbulent.

20. The electrode according to claim 19, wherein said gas inlets are arranged for providing said intermediate gas supply stream to the discharge space at a downstream angle relative to the main gas supply stream.

* * * * *